United States Patent
Kobayashi (12)
(10) Patent No.: US 6,927,634 B1
(45) Date of Patent: Aug. 9, 2005

(54) SELF-BIASED DARLINGTON AMPLIFIER

(75) Inventor: Kevin W. Kobayashi, Torrance, CA (US)

(73) Assignee: Sirenza Microdevices, Inc., Broomfield, CO (US)

( * ) Notice: Subject to any disclaimer, the term of this patent is extended or adjusted under 35 U.S.C. 154(b) by 0 days.

(21) Appl. No.: 10/623,070

(22) Filed: Jul. 18, 2003

(51) Int. Cl.$^7$ .............................................. H03F 3/04
(52) U.S. Cl. ...................................... 330/296; 330/285
(58) Field of Search ................................ 330/261, 267, 330/285, 288, 292, 296, 310, 311

(56) References Cited

U.S. PATENT DOCUMENTS

| | | | |
|---|---|---|---|
| 3,797,688 A | 3/1974 | Porcelli et al. | 215/9 |
| 4,077,013 A | 2/1978 | Morez et al. | 330/267 |
| 5,140,181 A | 8/1992 | Yoshino | 307/296.1 |
| 5,398,004 A | 3/1995 | Kobayashi | 330/293 |
| 5,467,058 A | 11/1995 | Fujita | 330/267 |
| 5,548,248 A * | 8/1996 | Wang | 330/288 |
| 6,069,534 A * | 5/2000 | Kobayashi | 330/263 |
| 6,753,734 B2 * | 6/2004 | Arell et al. | 330/296 |

OTHER PUBLICATIONS

I. Kipnis, et al. "Silicon Bipolar Fixed and Variable Gain Amplifier MMICs for Microwave and Lightwave Applications up to 6 GHz", IEEE 1989 Microwave and Millimeter-Wave Monolithic Circuits Symposium, pp. 101-104.

* cited by examiner

Primary Examiner—Khanh V. Nguyen
(74) Attorney, Agent, or Firm—Christopher P. Maiorana, PC (57) ABSTRACT

An apparatus comprising a Darlington transistor pair and a bias circuit. The Darlington transistor pair may be configured to generate an output signal at an output node in response to an input signal received through an input node. The bias circuit may be coupled between an output transistor of said Darlington transistor pair and the input node. The bias circuit generally comprises (a) a bias transistor, (b) a bypass capacitor, and (c) a resistor connected between a base of the bias transistor and base of the output transistor.

36 Claims, 13 Drawing Sheets

(CONVENTIONAL)

FIG. 1

(CONVENTIONAL)
FIG. 2

20 mA VARIATION OR +/- 14%

(CONVENTIONAL)

FIG. 3

(CONVENTIONAL) FIG. 4

SELF-BIASED DARLINGTON AMPLIFIER

FIELD OF THE INVENTION

The present invention relates to amplifiers generally and, more particularly to a method and/or architecture for implementing a self-biased Darlington amplifier.

BACKGROUND OF THE INVENTION

Conventional Darlington Amplifiers are often employed in a 3 terminal package (i.e., a SOT-89 package) or other 3 terminal style transistor package. Such amplifier packages are attractive because they typically have a small outline, a low cost, and a user-friendly implementation. Conventional 3-terminal transistor style packages typically allow one RF input, one RF output, and one reference ground terminal. The limited number of terminals imposes a constraint for bias solutions in Darlington amplifiers.

Figure 1:
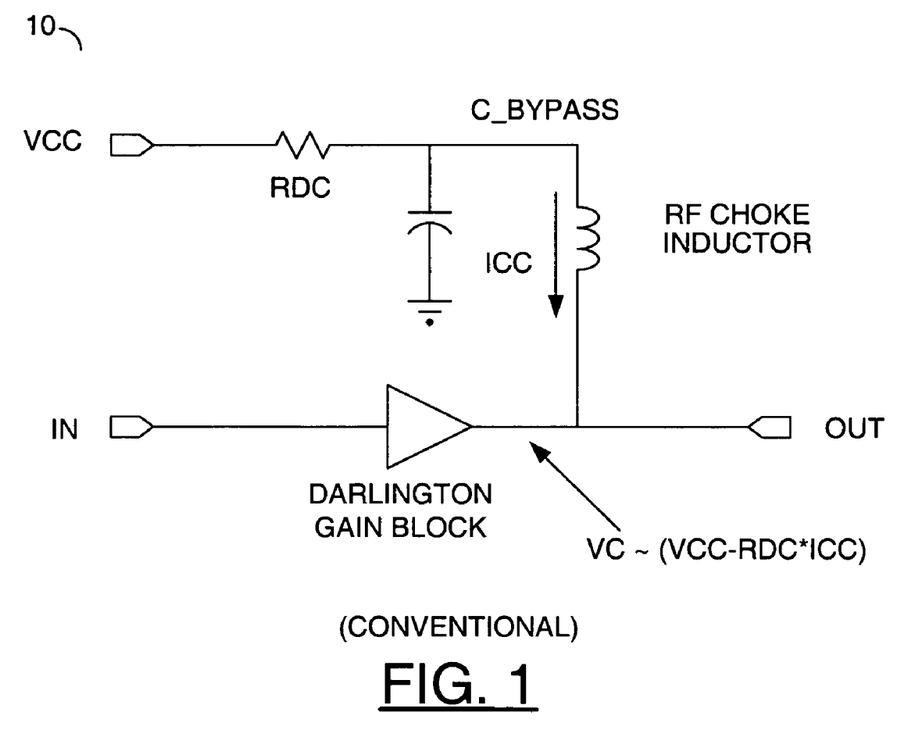
FIG. 1 is a diagram of a conventional amplifier.

Referring to FIG. 1, a circuit 10 illustrating a conventional Darlington gain block biasing scheme is shown. In the circuit 10, an off-chip bias set Resistor RDC is used to set a nominal bias current Icc presented through a gain block 12. The gain block 12 presents a signal OUT in response to a signal IN and the current Icc. Typically, the more voltage drop across the resistor RDC, the better the stability of the bias current Icc over temperature and supply variations.

The DC bias set resistor RDC sets the total current bias of the circuit 10. However, the DC bias set resistor RDC also creates a voltage drop, reducing the output voltage and RF headroom provided to the Darlington output stage.

The external DC bias set resistor RDC has one or more of the following disadvantages (a) a limited output voltage swing and power output, (b) a limited DC bias ramp up with input power (inhibiting class B operation), and/or (c) the need for a user to provide the external DC bias set resistor to set the bias of the amplifier.

Figure 2:
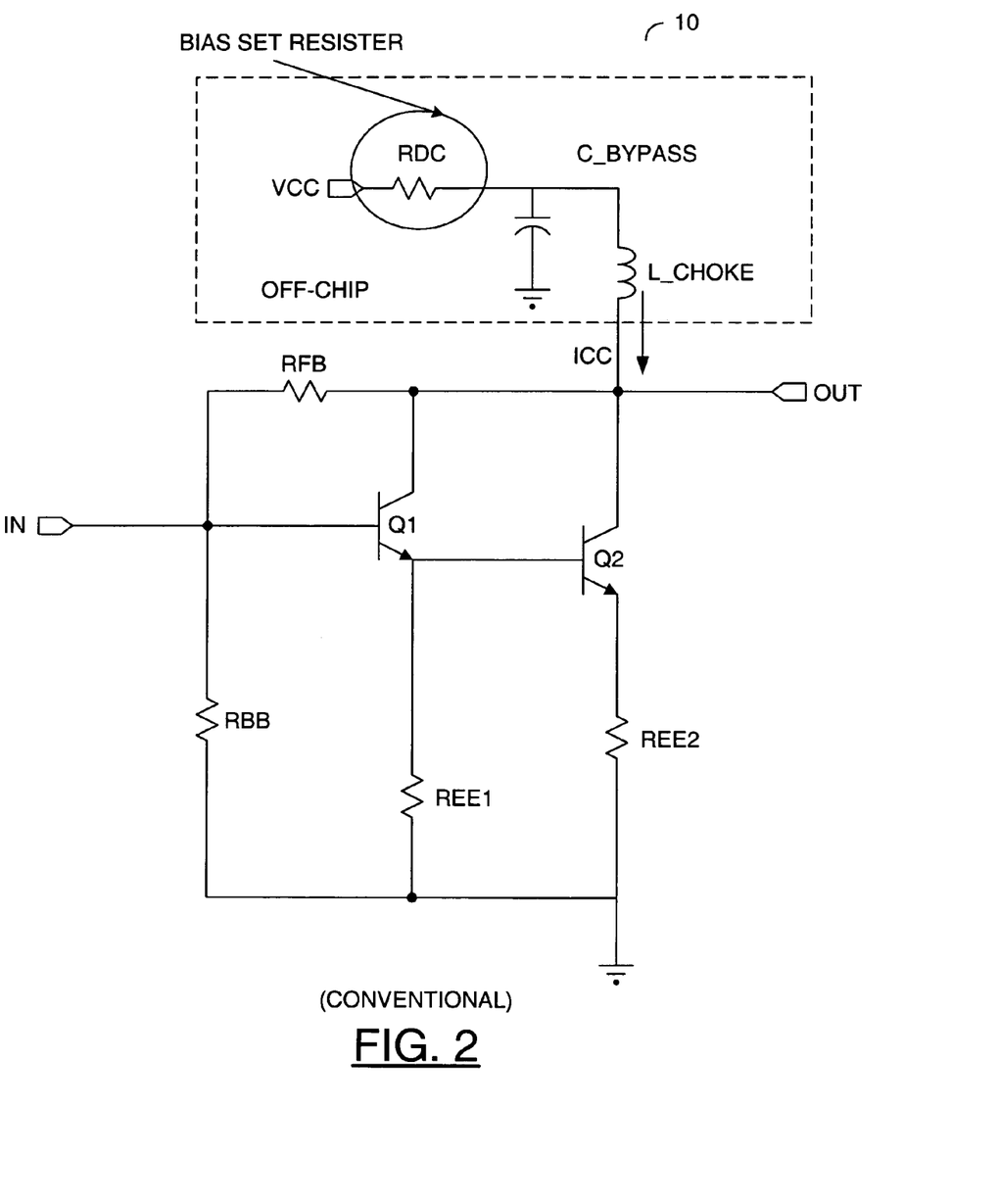
FIG. 2 is a diagram illustrating a conventional Darlington amplifier and bias arrangement.

Referring to FIG. 2, a more detailed diagram of the circuit 10 is shown. The larger the voltage drop across the resistor RDC, the lower the voltage applied to the collectors of the transistors Q1 and Q2 and the lower the value of the signal OUT. The reduced voltage swing of the signal OUT affects saturated output power, 1 dB compression, and output IP3 (third order intercept point).

Moreover, for class AB, B, and C operation (e.g., where the current Icc increases with input power), the resistor RDC will drop even more voltage, reducing the maximum output power capability. Conventional bias schemes therefore need the user to optimize the value of the resistors RDC in order to meet specific design criteria. Conventional setting the bias involves a trade-off between DC stability and radio frequency (RF) performance.

Figure 3:
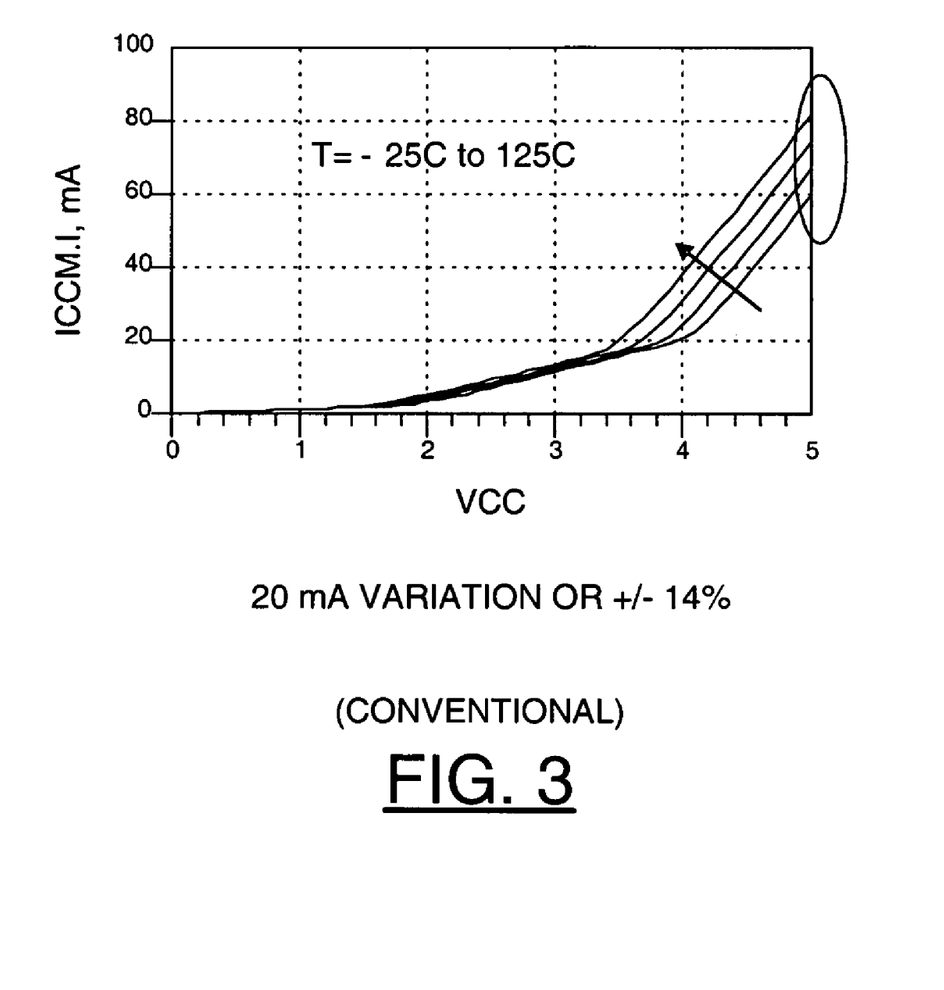
FIG. 3 is a simulated current-voltage characteristic of the conventional bias arrangement of FIG. 2.

Referring to FIG. 3, a diagram illustrating the simulated current-voltage characteristics of a conventional Darlington bias circuit 10 is shown. A bias variation of 20 mA at 5V over a −25° C. to 25° C. temperature change is shown.

Figure 4:
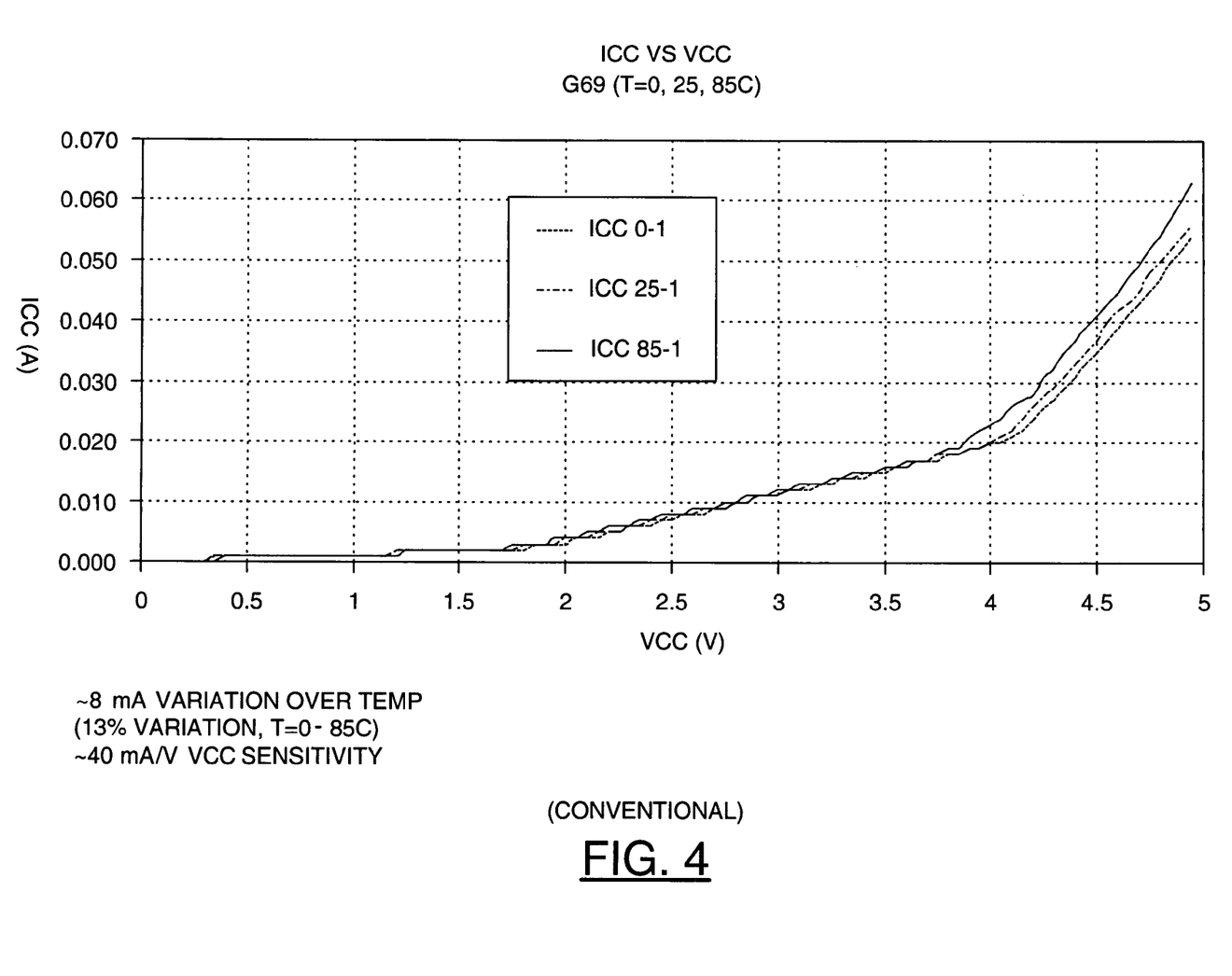
FIG. 4 is a diagram illustrating a measured current-voltage characteristic of the conventional bias arrangement of FIG. 2.

Referring to FIG. 4, a diagram illustrating a measured current-voltage characteristics of conventional bias of the circuit of FIG. 2 is shown. A bias variation of ~8–9 mA at 5V over a 0 to 85° C. temperature change is shown. The instantaneous slope of the I-V curve at 5V illustrates bias sensitivity to the supply voltage.

Figure 5:
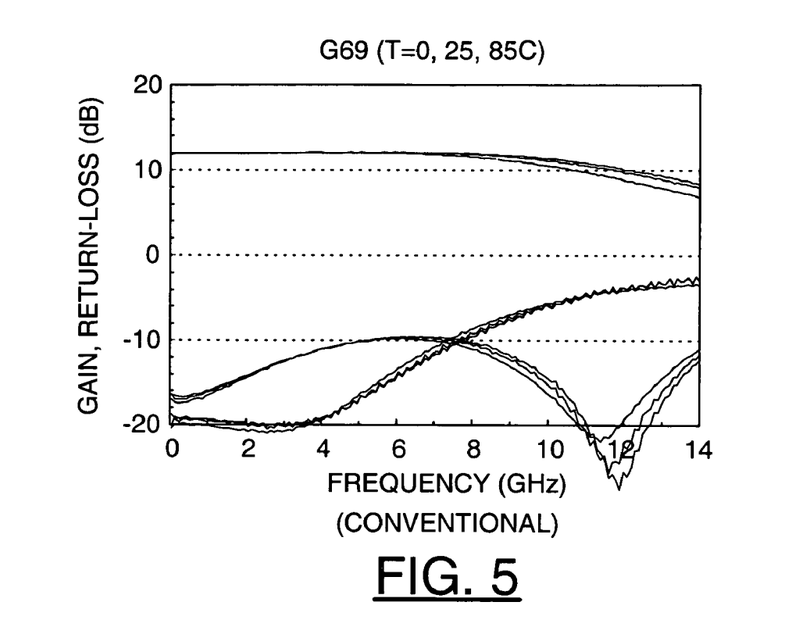
FIG. 5 is a diagram illustrating measured S-parameters over temperature comparison of the convention approach of FIG. 2.

Referring to FIG. 5, a diagram illustrating measured S-parameters over temperature comparison of the convention approach is shown. The gain changes by less than 0.5 dB over an 85 C. temperature (i.e., acceptable temperature gain variation).

It would be desirable to have a fully self-biased amplifier that does not need an external bias set resistor RDC where the amplifier maintains or improves (i) output voltage headroom and RF swing, (ii) tolerance to supply and temperature variations, (iii) enables class AB, B, C dynamic bias operation, and/or (iv) may be implemented in a 3-terminal package (e.g., 5512) traditionally having one RF input, one RF output, and one ground.

It would also be desirable to implement a self-bias solution for a Darlington amplifier that may (i) be implemented in a 3-terminal transistor style package such as the SOT-89, (ii) eliminate the need for an external DC bias resistor, and/or (iii) allow high output voltage headroom and output power.

It would also be desirable to implement a self-bias solution that (i) has a lower sensitivity to temperature and supply voltage variation, and/or (ii) may be monolithically integrated with the Darlington amplifier to reduce size, cost, and/or complexity of integration.

SUMMARY OF THE INVENTION

The present invention concerns an apparatus comprising a Darlington transistor pair and a bias circuit. The Darlington transistor pair may be configured to generate an output signal at an output node in response to an input signal received through an input node. The bias circuit may be coupled between an output transistor of said Darlington transistor pair and the input node. The bias circuit generally comprises (a) a bias transistor, (b) a bypass capacitor, and (c) a resistor connected between a base of the bias transistor and base of the output transistor.

The objects, features and advantages of the present invention include providing self-biased Darlington amplifier that may (i) increase the voltage supplied to an output device, (ii) improve output power efficiency and linearity, (iii) reduce the temperature sensitivity (e.g., by a factor of 2 over conventional approaches), (iv) reduce the supply voltage sensitivity (e.g., by a factor of 2 over conventional approaches), (v) enable dynamic bias operation (e.g., class AB or B), (vi) be monolithically integrated to reduce size and/or cost, and/or (vii) be applied to 3.3V SiGe HBT and Si BJT Darlington gain blocks.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may implement a self-bias Darlington Gain Block that may (i) eliminate a bias resistor (e.g., RDC), (ii) increase output voltage headroom, (iii) improve stability over temperature and supply voltage (e.g., Vcc) variations, and/or (iv) enable class AB biasing. In one example, the present invention may be implemented in a SOT-89 package. However, other packages, such as other 3-pin packages, may be implemented to meet the design criteria of a particular implementation.

Figure 6:
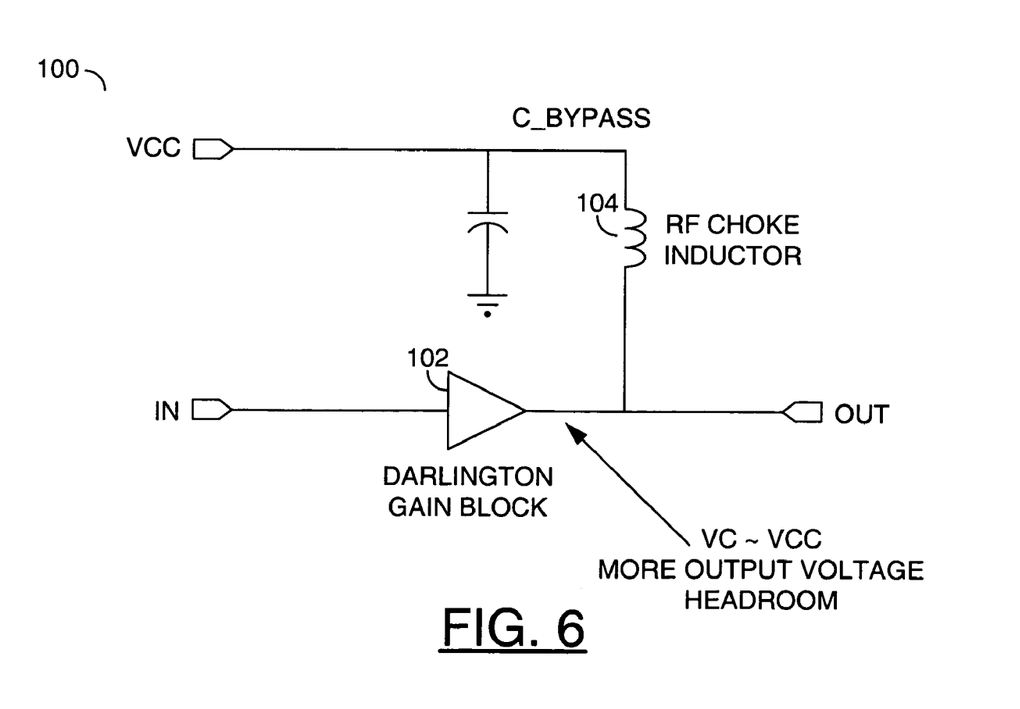
FIG. 6 is a diagram illustrating a preferred embodiment of the present invention.

Referring to FIG. 6, a diagram of a circuit 100 illustrating a preferred embodiment of the present invention is shown. The circuit 100 generally comprises a Darlington gain block 102, a capacitor (e.g., C_BYPASS) and an inductor 104. The inductor 104 may provide a radio frequency (RF) choke. The Darlington gain block 102 generally presents a signal (e.g., OUT) in response to a signal (e.g., IN) and a current presented through the inductor 104. The circuit 100 is implemented without the resistance RDC shown in FIG. 1 of the background section.

Figure 7:
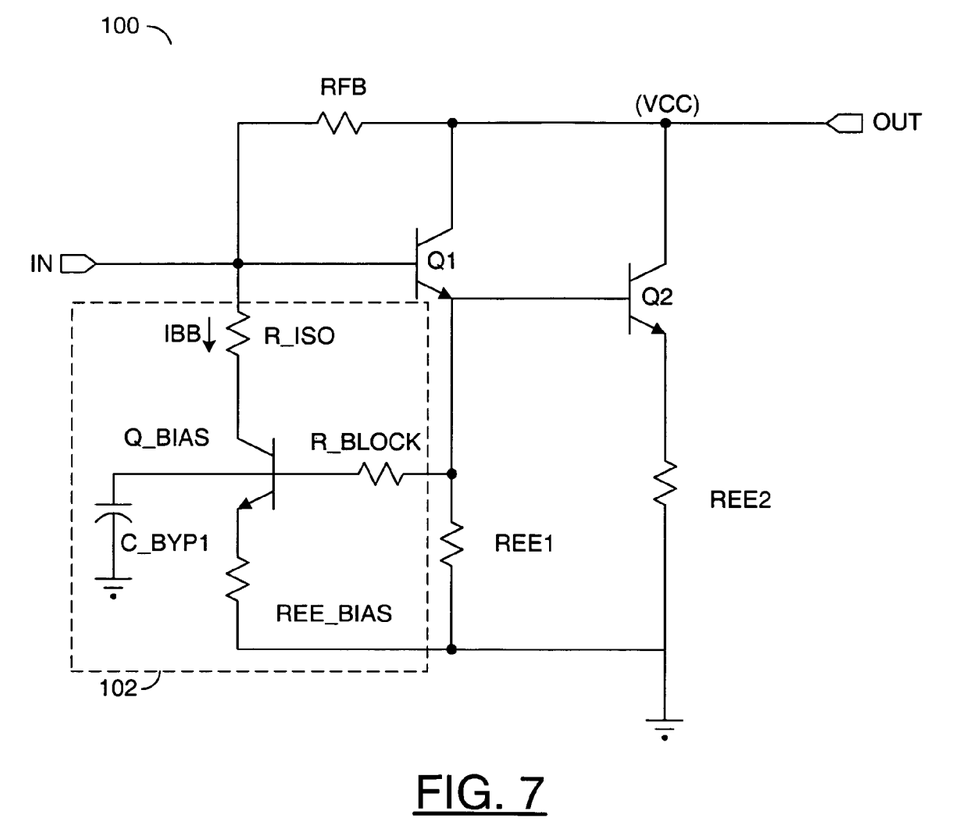
FIG. 7 is a more detailed diagram of the present invention.

Referring to FIG. 7, a more detailed diagram of the circuit 100 is shown. The circuit 100 illustrates a basic embodiment of the Self-biased Darlington amplifier in accordance with the present invention. A main amplifier may be implemented with a transistor Q1 and a transistor Q2. A bias section (or circuit) 102 is generally connected between the emitter and base of the transistor Q1. The bias section 102 may be implemented as a self-bias feedback circuit. The circuit 100 also comprises parallel feedback resistor RFB, a series feedback resistor REE2, and bias resistor REE1. The bias resistor REE1 may be used to bias the transistor Q1. The self-bias feedback circuit 102 may be used to stabilize the bias of the circuit 100 without relying on an external resistor (as in the conventional approach described in FIG. 2).

The self-bias feedback circuit 102 generally comprises a resistor (e.g., R_BLOCK), a transistor (e.g., Q_BIAS), a resistor (e.g., R_ISO), a resistor (e.g., REE_BIAS) and a capacitor (e.g., C_BYP2). The resistor R_BLOCK may be implemented as an RF blocking resistor. The transistor Q_BIAS may be implemented as a biasing transistor. The resistor R_ISO may be implemented as an RF isolation. The emitter biasing resistor REE_BIAS may be coupled between the emitter of the transistor Q_BIAS and ground. The capacitor C_BYP1 may be implemented as an AC bypass. The transistor Q_BIAS generally operates as a pseudo mirror bias transistor of the transistor Q2. The self-bias circuit 102 generally works in conjunction with the parallel feedback resistor RFB to set up a reference current (e.g., IBB). The current IBB is approximately mirrored to the output transistor Q2. The relationship between IBB and ICC2 is only approximate, but generally mirror each other in current over temperature, supply voltage, and input drive level variations. The ratio of the areas of the transistor Q_BIAS and the transistor Q2, and the emitter resistors REE_BIAS and REE2, are generally scaled in proportion to the bias currents IBB and ICC2, respectively. For example, if the current IBB is 1 mA and the current ICC2 is 100 mA, then the area of the transistor Q_BIAS may be implemented as $\frac{1}{100}^{th}$ of the area of the transistor Q2. The resistor REE_BIAS will generally be 100 time the value of the resistor REE2, approximately. However, other ratios may be implemented to meet the design criteria of a particular implementation.

The values of the resistor R_BLOCK and the resistor R_ISO are generally chosen for optimum RF performance versus DC bias sensitivity. For ideal RF performance, the resistor R_ISO should typically be greater than 10 Ω but less than 1,000 Ω. The value of the resistor R_BLOCK should typically be greater than 100 Ω but less than 10,000 Ω. DC stability may be forfeited in favor of RF performance (or vice versa) to obtain combinations outside of these ranges.

The bypass capacitor C_BYP1 and the blocking resistor R_BLOCK set the lower frequency limit of operation. The lower frequency may be extended by increasing either or both values of the capacitor C_BYP1 and the resistor R_BLOCK. However, increasing the value of the resistance of the resistor R_BLOCK will generally degrade the bias mirroring relationship between the transistor Q_BIAS and the transistor Q2. In a sense, the self-biased amplifier 100 resembles a type of DC current mirror, except that the circuit 100 provides well defined RF input and output terminals. The DC mirror operation is less than ideal due to the RF blocking resistor.

Figure 8:
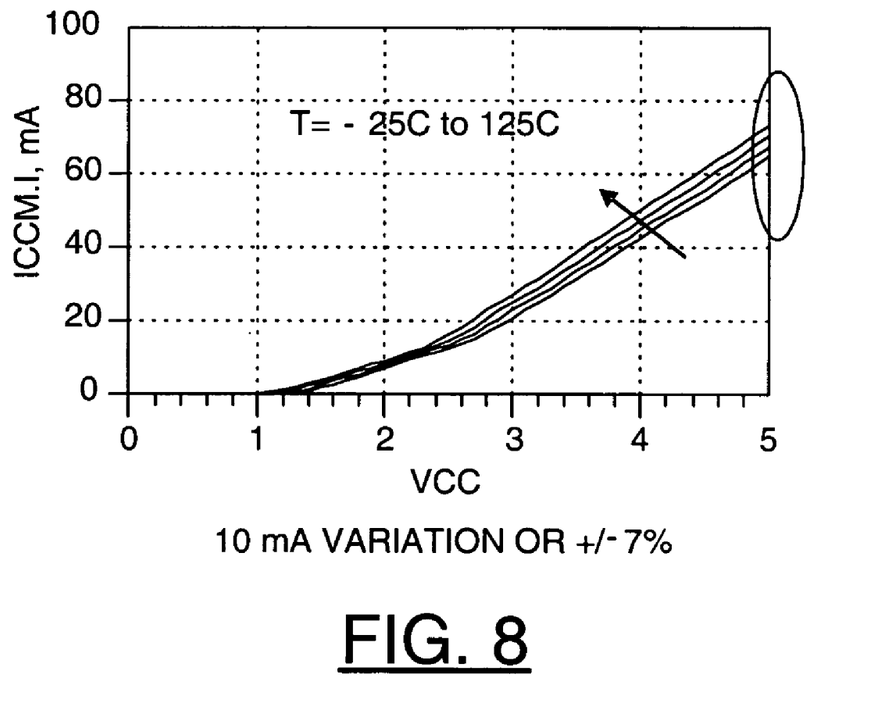
FIG. 8 is a diagram illustrating simulated current-voltage characteristics of the present invention.

Referring to FIG. 8, a diagram illustrating the simulated current-voltage characteristics of the self-bias circuit of the present invention is shown. A 10 mA variation for the present invention is illustrated. The temperature sensitivity of the new self-bias circuit has been improved by a factor of 2 over the conventional bias approach of FIG. 2. The bias sensitivity of the present invention is generally a factor of 2 better than the conventional case.

Figure 9:
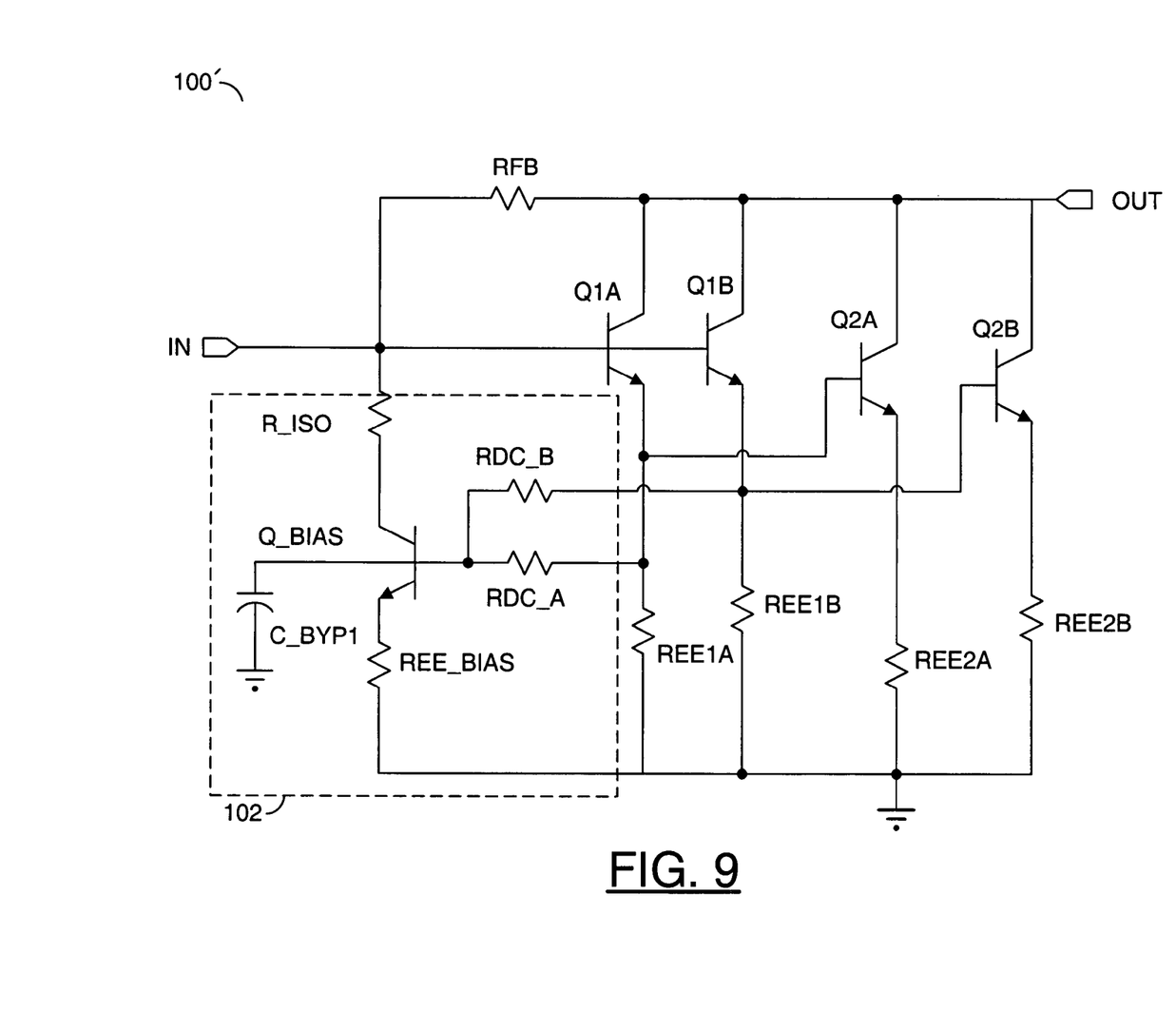
FIG. 9 is a diagram illustrating a self-bias circuit applied to a thermally distributed Darlington amplifier.

Referring to FIG. 9, a circuit 100 illustrates an embodiment of the invention is shown illustrating the self-bias circuit 102 applied to a thermally distributed Darlington amplifier. The distributed Darlington is a practical employment to improve the thermal and reliability performance of the chip by spatially distributing the hot component of the chip layout design. An example of a thermally distributed Darlington amplifier may be found in co-pending application Ser. No. 09/888,865, which is hereby incorporated by reference in its entirety.

A plurality of RF blocking resistors (e.g., RDC_B, RDC_A, . . . ) which the couple DC bias from a plurality of Darlington input transistors (e.g., Q1A, Q1B, . . . ) to a single bias transistor Q_BIAS, which sets up the reference current for all the Darlington output transistors (e.g., Q2A, Q2B, . . . ).

Figure 10:
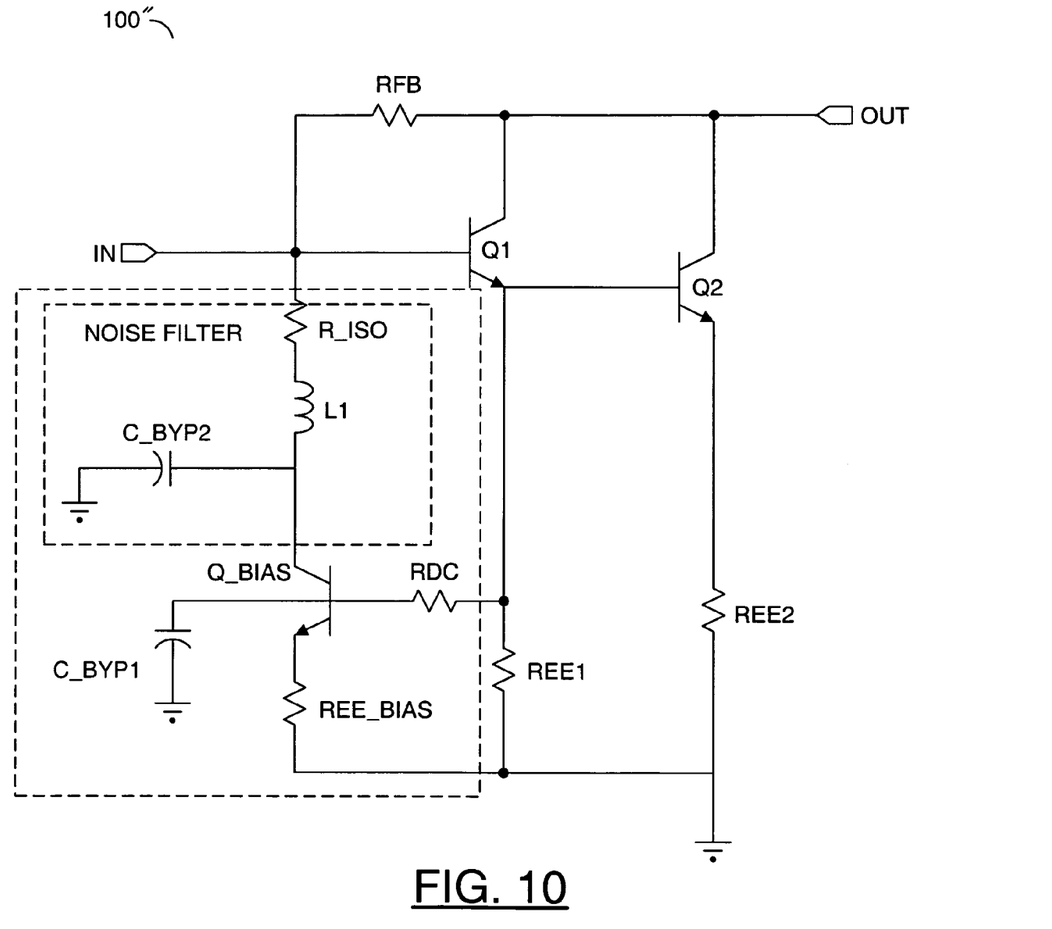
FIG. 10 illustrates a low noise embodiment of the invention that may provide an improvement in the noise performance of the embodiment of the invention illustrated in FIGS. 6 and 7.

Referring to FIG. 10, a circuit 100″ is shown illustrating an example of a low noise embodiment of the invention. The circuit 100″ may improve the noise performance. An additional RF choke inductor (e.g., L1) and bypass capacitor (e.g., C_BYP2) may provide a low pass filter to filter out the high frequency noise contributions of the bias transistor Q_BIAS. The resistor R_ISO may also preserve the gain and return-loss performance at lower frequencies. The low frequency noise operation is generally determined by both the capacitor C_BYP2 and the inductor L1. The higher the values, the lower the low-noise frequency of operation. Typically, the various components of the circuit 100" may be integrated monolithically on a single chip. An external bypass capacitor (not shown) in parallel with the capacitor C_BYP2 may be used to extend this lower frequency band edge.

Figure 11:
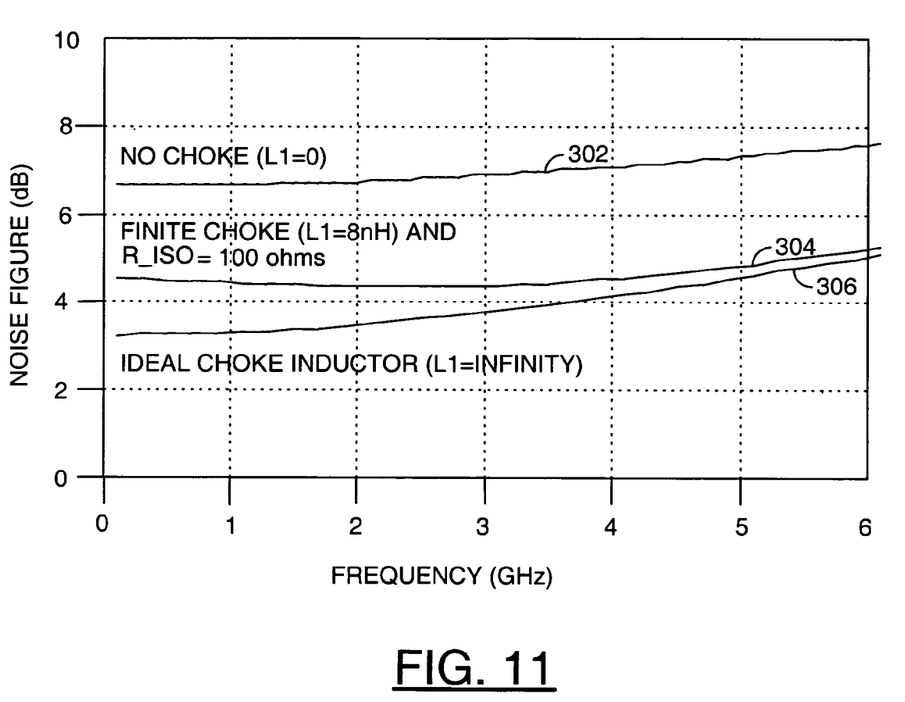
FIG. 11 illustrates a noise improvement of the circuit of FIG. 9 compared with the circuits of FIGS. 6 and 7.

Referring to FIG. 11, a diagram illustrating the noise improvement gained by employing the additional filter components is shown. The curve 302 (e.g., No Choke(L1=0)) represents the noise figure performance obtained from the circuit 100 where the self-bias circuit is directly coupled to the input. The curve 306 (e.g., Ideal Choke Inductor (L1=Infinity)) represents the noise figure performance obtained from employing an ideal choke L1, with the circuit 100". The curve 304 (e.g., "Finite Choke (L1=8 nH) and R_ISO=100 ohms) represents the noise figure performance obtained with a practical monolithic choke of 8 nH and isolation resistor of 100 ohms. The outer curves represent the achievable improvement in noise which can be gained by integrating an LRC filter with the self-bias circuit.

Figure 12:
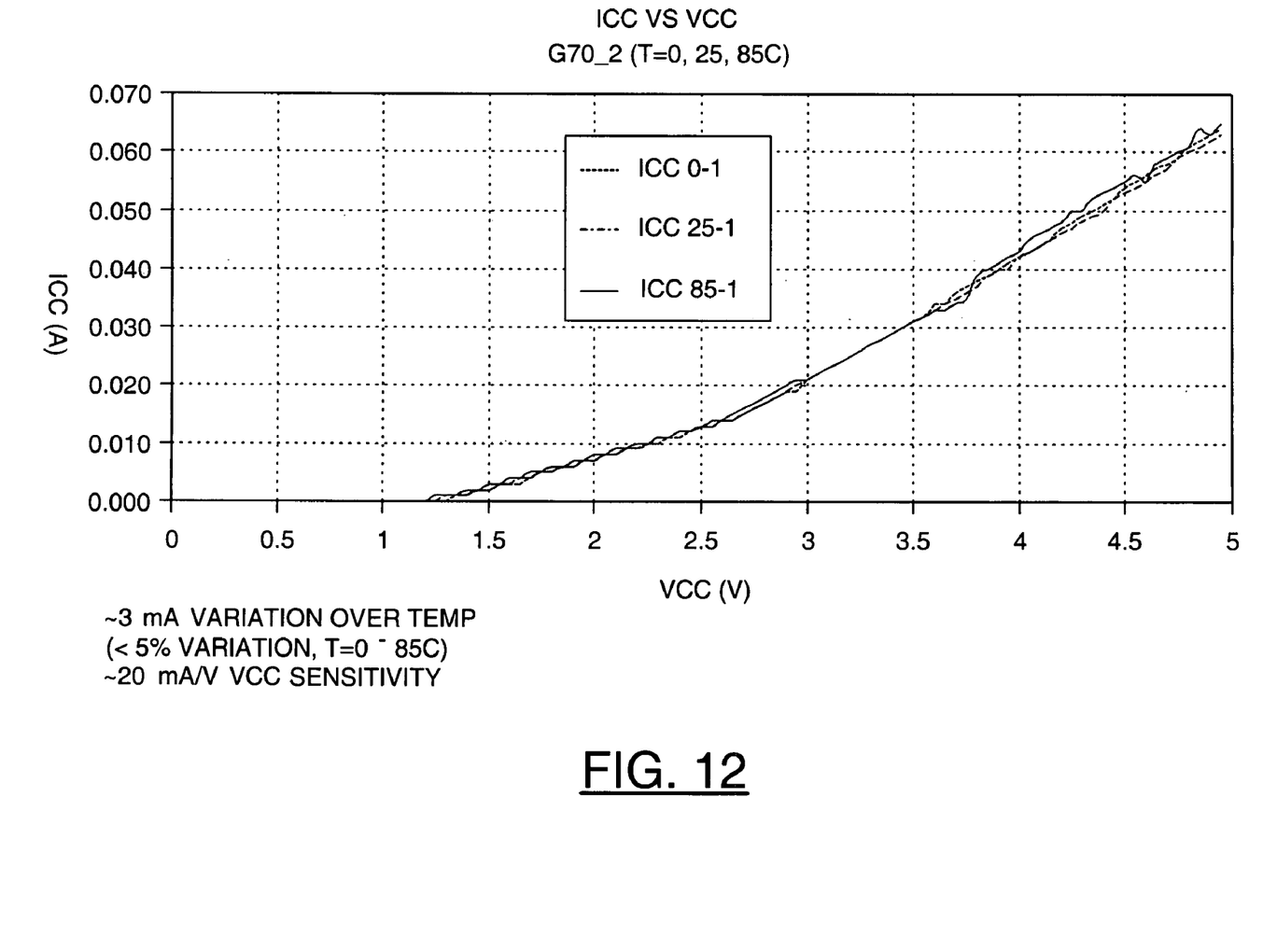
FIG. 12 is a diagram illustrating a measured current-voltage characteristic of the self-bias approach of the present invention.

Referring to FIG. 12, a diagram illustrating a measured current-voltage characteristic of self-bias of the present invention is shown. The bias sensitivity illustrates an improvement by a factor of two over the conventional case (FIG. 3).

Figure 13:
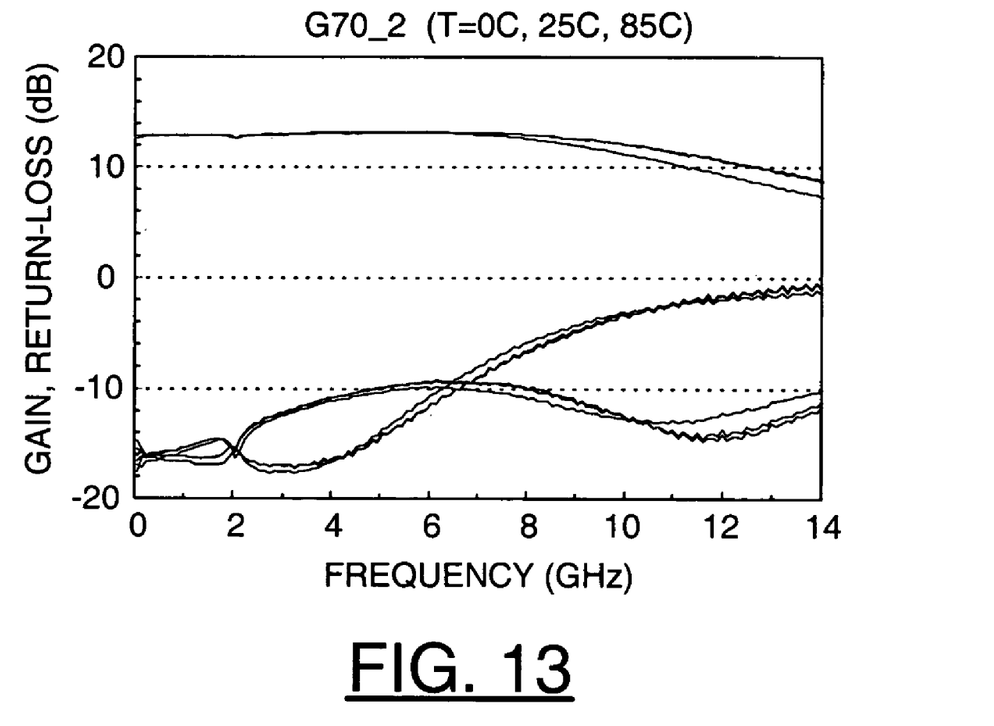
FIG. 13 is a diagram illustrating measured S-parameter of the self-bias of the present invention.

Referring to FIG. 13, a diagram illustrating measured S-parameter of the self-bias of the present invention is shown. The gain and return loss sensitivity over temperature illustrates acceptable operation.

The gain and return loss sensitivity over temperature is similar for both cases indicating that the new self-bias approach is as well behaved as the conventional approach. Gain for both cases changes by less than 0.5 dB over an 85 C. temperature change indicating good temperature gain insensitivity.

Figure 14:
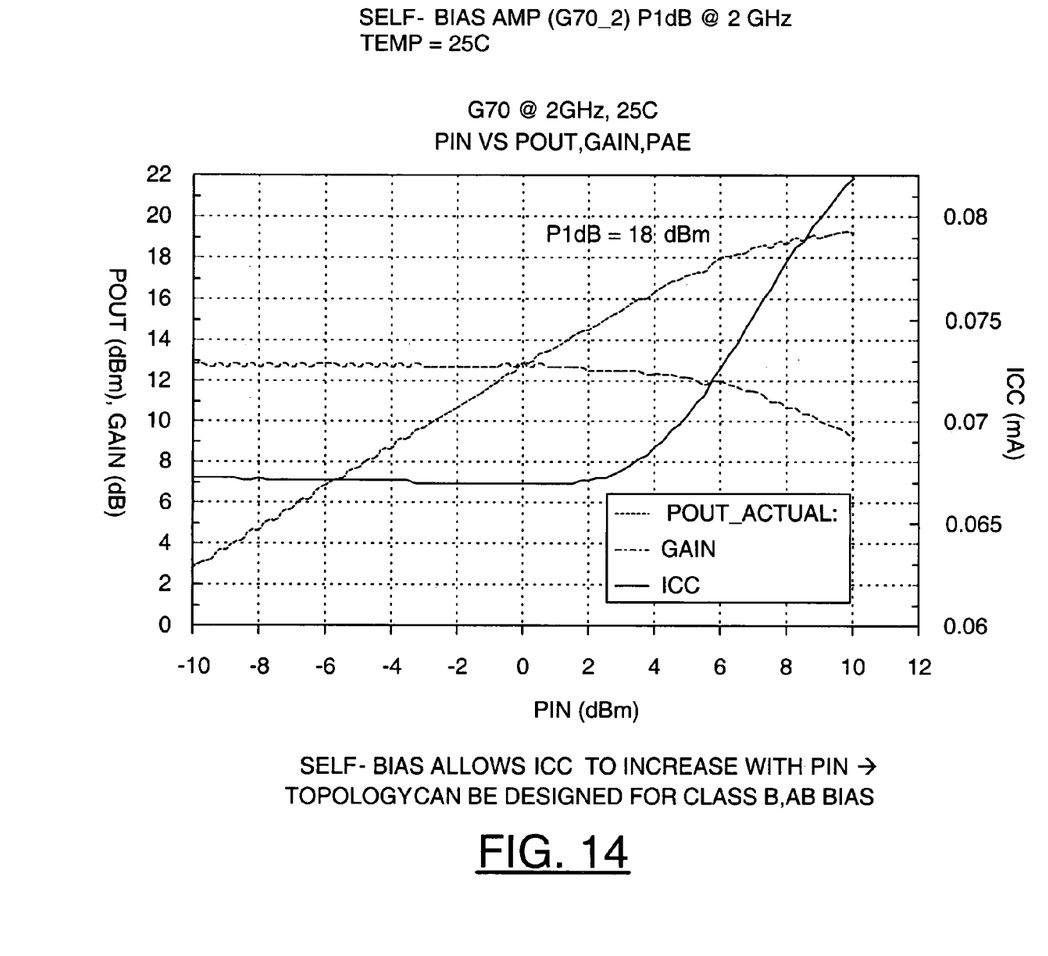
FIG. 14 is a diagram illustrating measured output power, gain, and bias current of the present invention illustrating class AB operation.

Referring to FIG. 14, an example of the Measured Pout, ICC, and Gain versus input power Pin, @ 2 Ghz and T=25 C. is shown. FIG. 14 illustrates that good output power and gain compression characteristics (e.g., greater than 18 dBm) can be obtained using the new self-biased Darlington approach. Moreover, this plot illustrates that the new self-bias can allow class AB or B dynamic bias operation as evident by the increase in the amplifier bias current ICC as input power PIN is increased. This is a fundamental limitation observed in the conventional Darlington bias when using an external set resistor which tends reduce DC output voltage headroom as input power, PIN (and ICC) is increased.

The transistors described herein may be implemented as bipolar junction transistors (BJTs), heterojunction bipolar transistors (HBTs), double heterojunction bipolar transistors (DHBT) or pseudomorphic high electron mobility transistors (PHEMT). However, other transistors with similar characteristics may be implemented to meet the design criteria of a particular implementation. In particular, the various transistors of the present invention may be implemented using a variety of process technologies. For example, any or all semiconductors, including compound semiconductors, III–V semiconductors, Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a Darlington transistor pair configured to generate an output signal at an output node in response to an input signal received through an input node;
   a bias circuit coupled between an output transistor of said Darlington transistor pair and said input node, said bias circuit comprising (a) a bias transistor, (b) a bypass capacitor, and (c) a resistor connected between a base of said bias transistor and base of said output transistor; and
   an isolation resistor coupled between said input node and a collector of said bias transistor, said isolation resistor configured to improve low frequency radio frequency (RF) response.

2. The apparatus according to claim 1, wherein said bias circuit further comprises:
   an emitter bias resistor configured to set a class A, AB, B or other quiescent bias state.

3. The apparatus according to claim 1, further comprising:
   a low noise filter implementation (i) comprising at least one choke inductor and at least one bypass capacitor and (ii) coupled between said bias transistor and said input node.

4. The apparatus according to claim 1, further comprising:
   a feedback resistor coupled between a collector of said bias transistor and said output node, said feedback resistor configured to set the bias current of said apparatus.

5. The apparatus according to claim 1, wherein said apparatus is monolithically integrated.

6. The apparatus according to claim 1, wherein said apparatus is packaged in a 3-terminal package.

7. The apparatus according to claim 1, wherein said apparatus comprises a self-bias Darlington amplifier.

8. The apparatus according to claim 1, wherein said apparatus is tolerant to supply and temperature variations.

9. The apparatus according to claim 1, wherein said apparatus enables dynamic bias operation.

10. The apparatus according to claim 1, wherein said apparatus is implemented using 3.3V SiGe HBT and Si BJT Darlington gain blocks.

11. The apparatus according to claim 1, wherein said Darlington transistor pair comprises a distributed Darlington amplifier.

12. An apparatus comprising:
    a Darlington transistor pair configured to generate an output signal at an output node in response to an input signal received through an input node;
    means for coupling between an output transistor of said Darlington transistor pair and said input node comprising (a) a bias transistor, (b) a bypass capacitor, and (c) a resistor connected between a base of said bias transistor and base of said output transistor; and
    means for implementing an isolation resistor coupled between said input node and a collector of said bias transistor, said isolation resistor configured to improve low frequency radio frequency (RF) response.

13. A method for self-biasing a Darlington amplifier comprising the steps of:
   (A) implementing a Darlington transistor pair configured to generate an output signal at an output node in response to an input signal received through an input node;
   (B) coupling a bias circuit between an output transistor of said Darlington transistor pair and said input node, said bias circuit comprising (a) a bias transistor, (b) a bypass capacitor, and (c) a resistor connected between a base of said bias transistor and base of said output transistor; and
   (C) coupling an isolation resistor between said input node and a collector of said bias transistor, said isolation resistor configured to improve low frequency radio frequency (RF) response.

14. The method according to claim 13, wherein said bias circuit further comprises:
   an emitter bias resistor configured to set a class A, AB, B or other quiescent bias state.

15. The method according to claim 13, further comprising:
   implementing a low noise filter (i) comprising at least one choke inductor and at least one bypass capacitor and (ii) coupled between said bias transistor and said input node.

16. The method according to claim 13, further comprising:
   implementing a bias feedback resistor coupled between said collector of said bias transistor and said output node.

17. The method according to claim 13, wherein said Darlington transistor pair and said bias circuit are monolithically integrated.

18. The method according to claim 13, wherein said Darlington transistor pair and said bias circuit are packaged in a 3-terminal package.

19. The method according to claim 13, further comprising the step of:
   implementing a filter comprising at least one bypass capacitor coupled between said bias transistor and said input node.

20. The method according to claim 13, further comprising the step of:
   implementing a filter comprising at least one inductor coupled between said bias transistor and said input node.

21. An apparatus comprising:
   a Darlington transistor pair configured to generate an output signal at an output node in response to an input signal received through an input node;
   a bias circuit coupled between an output transistor of said Darlington transistor pair and said input node, said bias circuit comprising (a) a bias transistor having a collector coupled to said input node, (b) a bypass capacitor, and (c) a choke resistor connected between a base of said bias transistor and base of said output transistor.

22. An apparatus comprising:
   a Darlington transistor pair configured to generate an output signal at an output node in response to an input signal received through an input node;
   a bias circuit coupled between an output transistor of said Darlington transistor pair and said input node, said bias circuit comprising (a) a bias transistor, (b) a bypass capacitor, and (c) a choke resistor connected between a base of said bias transistor and base of said output transistor; and
   a low noise filter implementation coupled between said bias transistor and said input node, comprising at least one choke inductor and at least one bypass capacitor.

23. An apparatus comprising:
   a Darlington transistor pair configured to generate an output signal at an output node in response to an input signal received through an input node;
   a bias circuit coupled between an output transistor of said Darlington transistor pair and said input node, said bias circuit comprising (a) a bias transistor, (b) a bypass capacitor, and (c) a resistor connected between a base of said bias transistor and base of said output transistor; and
   a low noise filter implementation coupled between said bias transistor and said input node, comprising at least one choke inductor.

24. The apparatus according to claim 23, further comprising:
   a feedback resistor coupled between said output node and said input node of said Darlington transistor pair.

25. The apparatus according to claim 23, further comprising:
   a feedback resistor coupled between a collector of said bias transistor and said output node.

26. An apparatus comprising:
   a Darlington transistor pair configured to generate an output signal at an output node in response to an input signal received through an input node;
   a bias circuit coupled between an output transistor of said Darlington transistor pair and said input node, said bias circuit comprising (a) a bias transistor, (b) a bypass capacitor, and (c) a resistor connected between a base of said bias transistor and base of said output transistor; and
   a low noise filter implementation coupled between said bias transistor and said input node, comprising at least one bypass capacitor.

27. The apparatus according to claim 26, further comprising:
   a feedback resistor coupled between said output node and said input node of said Darlington transistor pair.

28. The apparatus according to claim 26, further comprising:
   a feedback resistor coupled between said output node and a collector of said bias transistor.

29. An apparatus comprising:
   a Darlington transistor pair configured to generate an output signal at an output node in response to an input signal received through an input node;
   a bias circuit coupled between an output transistor of said Darlington transistor pair and said input node, said bias circuit comprising (a) a bias transistor, (b) a bypass capacitor, and (c) a resistor connected between a base of said bias transistor and base of said output transistor; and
   a feedback resistor coupled between a collector of each transistor of said Darlington transistor pair and said input node of said Darlington transistor pair.

30. The apparatus according to claim 29, wherein said feedback resistor is used to set the nominal bias current of said apparatus.

31. The apparatus according to claim 29, further comprising:
   a filter coupled to a collector of said bias transistor.

32. The apparatus according to claim 31, wherein said filter comprises at least one bypass capacitor.

33. An apparatus comprising:
 a Darlington transistor pair configured to generate an output signal at an output node in response to an input signal received through an input node;
 a bias circuit coupled between an output transistor of said Darlington transistor pair and said input node, said bias circuit comprising (a) a bias transistor, (b) a bypass capacitor, and (c) a resistor connected between a base of said bias transistor and base of said output transistor; and
 a feedback resistor coupled between a collector of the bias transistor and a collector of each transistor of said Darlington transistor pair.

34. The apparatus according to claim 33, wherein said apparatus further comprises:
 an isolation resistor coupled between said input node and a collector of said bias transistor, said isolation resistor configured to improve low frequency radio frequency (RF) response.

35. A method for self-biasing a Darlington amplifier comprising the steps of:
 (A) implementing a Darlington transistor pair configured to generate an output signal at an output node in response to an input signal received through an input node;
 (B) coupling a bias circuit between an output transistor of said Darlington transistor pair and said input node, said bias circuit comprising (a) a bias transistor, (b) a bypass capacitor, and (c) a resistor connected between a base of said bias transistor and base of said output transistor; and
 (C) implementing a low noise filter comprising at least one choke inductor and at least one bypass capacitor coupled between said bias transistor and said input node.

36. The method according to claim 35, further comprising the step of:
 implementing a feedback resistor coupled between said output node and said input node of said Darlington pair.

* * * * *